(12) United States Patent
Morris et al.

(10) Patent No.: US 7,732,253 B1
(45) Date of Patent: Jun. 8, 2010

(54) FLIP-CHIP ASSEMBLY WITH IMPROVED INTERCONNECT

(75) Inventors: T. Scott Morris, Clemmons, NC (US); Mohsen Haji-Rahim, Chapel Hill, NC (US); Milind Shah, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 685 days.

(21) Appl. No.: 11/464,306

(22) Filed: Aug. 14, 2006

(51) Int. Cl.
*H01L 21/50* (2006.01)

(52) U.S. Cl. .................. 438/108; 438/612; 438/613; 438/614; 438/107; 257/778; 257/781; 257/780; 257/786; 257/E21.511

(58) Field of Classification Search ............ 438/103, 438/612, 108, 613, 614, 107; 257/778, 781, 257/780, 786, E21.511
See application file for complete search history.

(56) References Cited

U.S. PATENT DOCUMENTS

| | | | | |
|---|---|---|---|---|
| 3,881,799 A | * | 5/1975 | Elliott et al. ............... | 439/816 |
| 3,993,515 A | * | 11/1976 | Reichert ................. | 438/605 |
| 6,578,754 B1 | | 6/2003 | Tung | |
| 6,592,019 B2 | * | 7/2003 | Tung ......................... | 228/197 |
| 6,681,982 B2 | | 1/2004 | Tung | |
| 2004/0084206 A1 | * | 5/2004 | Tung ......................... | 174/255 |
| 2006/0049524 A1 | * | 3/2006 | Lin et al. ................... | 257/750 |
| 2006/0252248 A1 | * | 11/2006 | Hu ............................ | 438/613 |

\* cited by examiner

*Primary Examiner*—Lynne A Gurley
*Assistant Examiner*—Junghwa M Im
(74) *Attorney, Agent, or Firm*—Withrow & Terranova, P.L.L.C.

(57) ABSTRACT

The present invention provides a unique way of connecting a flip-chip die to a substrate. Initially, metallic posts are formed on the flip-chip die and solder bumps are placed on the substrate where the metallic post will ultimately connect to the substrate. The tip layer of flash gold, tin, or other wettable electroplated material is applied to the tips of the metallic posts to prevent oxidation and enhance wettability. The sides of the metallic posts are allowed to oxidize to reduce wettability. To attach the flip-chip die to the substrate, the flip-chip die is initially positioned over the substrate, such that the metallic posts align with and come into contact with the solder bumps. Once the flip-chip die is in place over the substrate, the substrate and the flip-chip are heated to cause the solder bumps to reflow and bond to the tip layers of the metallic posts.

20 Claims, 4 Drawing Sheets

FLIP-CHIP ASSEMBLY WITH IMPROVED INTERCONNECT

FIELD OF THE INVENTION

The present invention relates to flip-chip assemblies, and more particularly relates to an improved technique for connecting a flip-chip die to a substrate.

BACKGROUND OF THE INVENTION

Flip-chip assembly, also known as direct chip attachment, is a method for electrically connecting a die directly to a substrate. In flip-chip assembly, conductive bumps are attached to an upper surface of a die. The die is then flipped over and placed face down on top of and in contact with the substrate in order to establish an electrical connection. In contrast, other assembly methods use wire bonds to connect the die to the substrate. These alternative assembly methods require the die to be attached to the substrate face up, and wires to be bonded to the die, then looped and electrically connected to the substrate.

Incorporating flip-chip technology in the semiconductor device manufacturing process offers a number of advantages over using standard assembly methods. These advantages include decreasing the size of the footprint of the device, while increasing performance, flexibility, and reliability. The use of flip-chip technology eliminates the space needed for wire bonding and die surface area of a package, which essentially reduces the overall size of the package. In addition, the elimination of wire connections and implementation of a shorter electrical path from the die to the substrate by way of a conductive bump connection reduces inductance and capacitance.

The flip-chip method is also more flexible than the standard methods of assembly. Flip-chip technology allows use of the entire surface area of the die for the conductive bump connections, whereas standard methods using wire bond connections are generally limited to the perimeter of the die. Therefore, to achieve a comparable number of connections, the die size for a standard method of assembly would have to be greatly increased. Lastly, an adhesive underfill material may be placed between the die and the substrate to increase mechanical reliability.

With the increasing demand for flip-chip technology in the semiconductor manufacturing industry, there is a need to further improve the connection between the flip-chip die and the substrate in a flip-chip assembly. There is a need to increase the density of interconnects to accommodate the ever increasing number of connection points and ever decreasing size of the flip-chip die. There is also a need to increase the stability, thermal performance, and integrity of the flip-chip assembly.

SUMMARY OF THE INVENTION

The present invention provides a method for connecting a flip-chip die to a substrate. Initially, metallic posts, are formed on the flip-chip die and solder bumps are placed on the substrate where the metallic post will ultimately connect to the substrate. The tip layer of flash gold, tin, or other wettable electroplated material, is applied to the tips of the metallic posts to prevent oxidation and enhance wettability. The sides of the metallic posts are allowed to oxidize to reduce wettability. To attach the flip-chip die to the substrate, the flip-chip die is initially positioned over the substrate, such that the metallic posts align with and come into contact with the solder bumps. Once the flip-chip die is in place over the substrate, the substrate and the flip-chip are heated to cause the solder bumps to reflow and bond to the tip layers of the metallic posts.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
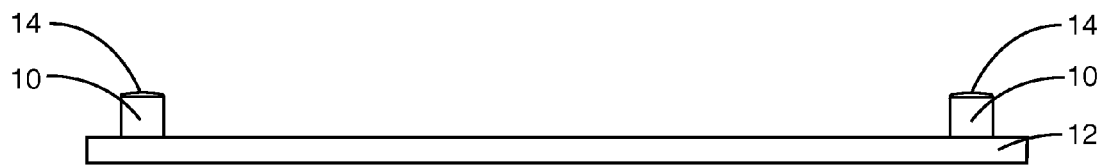
FIGS. 1-3 depict a process for attaching a flip-chip die to a substrate according to one embodiment of the present invention.
Figure 2:

The present invention provides a method for connecting a flip-chip die to a substrate using metallic posts. Although various types of metal may be used to form these metallic posts, the following examples incorporate copper as the preferred metal to use when forming the metallic posts. With reference to FIG. 1, copper posts 10 are initially formed on the flip-chip die 12. A tip layer 14 of flash gold, tin, or other wettable electroplated material is applied to the tips of the copper posts 10 to enhance wettability and prevent oxidation at the tips of the copper posts 10. The sides of the copper posts 10 are allowed to oxidize to reduce wettability. Notably, solder is not placed on the tips of the copper posts. Instead, solder bumps 16 are placed on the substrate 18 where the copper posts 10 will ultimately connect to the substrate 18, as illustrated in FIG. 2. A screen-printing process or the like may be used to apply the solder paste to the substrate 18. The substrate 18 may be a laminate, lead frame, or the like. The solder bumps 16, which may be tin-silver, a tin and lead composite, or the like, are approximately 75 µm to 100 µm in height in one embodiment. Heights of less than 75 µm and greater than 100 µm are possible.

Figure 3:
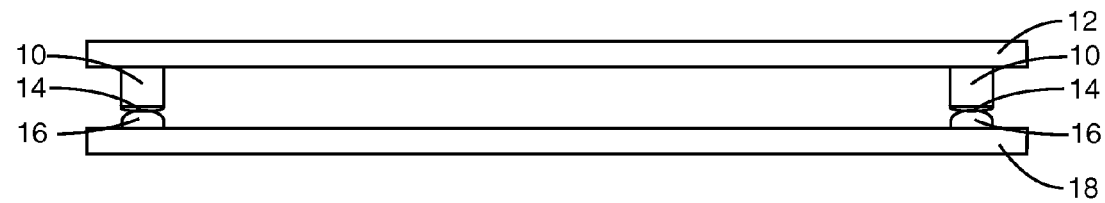

To attach the flip-chip die 12 to the substrate 18, the flip-chip die 12 is initially inverted and positioned over the substrate 18, such that the copper posts 10 align with and come into contact with the solder bumps 16 of the substrate 18, as illustrated in FIG. 3. Once the flip-chip die 12 is in place over the substrate 18, the flip-chip die 12 and the substrate 18 are heated to cause the solder bumps 16 to reflow and bond to the tip layers 14 of the copper posts 10 to create a flip-chip assembly.

Figure 4:
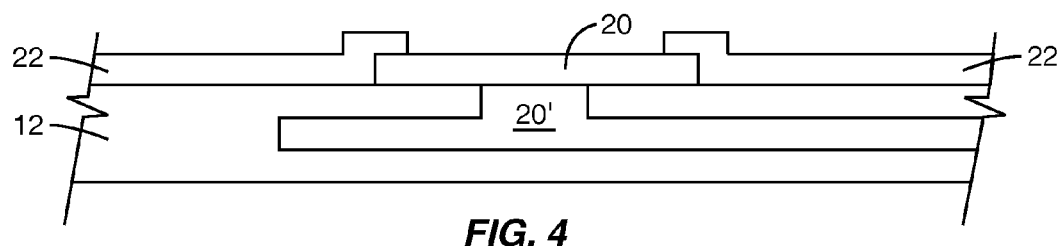
FIGS. 4-11 depict a process for manufacturing a copper post according to one embodiment of the present invention.

With reference to FIGS. 4 through 11, a process for forming the copper posts 10 on the flip-chip die 12 is provided according to one embodiment of the present invention. The manufacturing process begins by forming a bond pad 20, which may be gold, aluminum, copper, or other conductive material, over a portion of the top of the flip-chip die 12, as shown in FIG. 4. This bond pad 20 may be used as a metal pad upon which the copper posts 10 are formed. A metal trace or signal 20' may be connected to the bond pad 20 on or within the flip-chip die 12. Next, a passivation layer 22 is formed over the surface of the flip-chip die 12 around the bond pad 20. The passivation layer 22 may cover the perimeter of the bond pad 20. The passivation layer 22 may be silicon nitride, silicon dioxide, polyimide, benzocyclobutene, or other glassivation material layer, and may function to protect the surface of the flip-chip die 12 from further processing.

Figure 5:
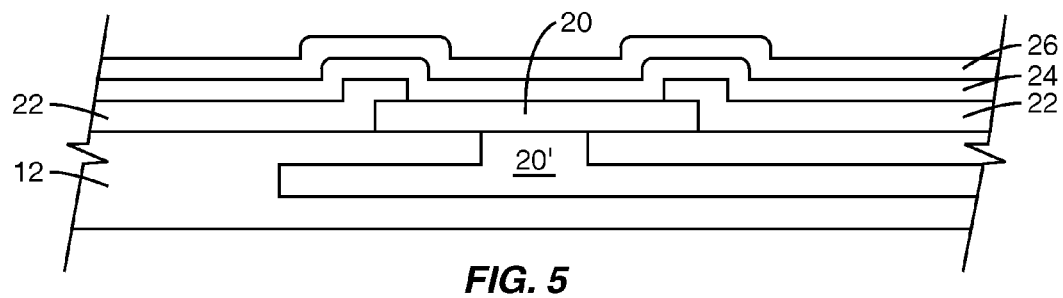

Next, a barrier layer 24, which may be titanium, titanium tungsten, or the like, is deposited over the bond pad 20 and passivation layer 22 by sputtering or other deposition methods, as shown in FIG. 5. The barrier layer 24 improves reliability, provides a moisture barrier, allows the flip-chip die 12 to better adhere to the copper posts 10, and acts as a barrier during the subsequent electro-plating process. A seed layer 26, which may be gold, copper, or the like, is deposited onto the barrier layer 24, in order to promote the growth of copper during the electroplating process.

Figure 6:
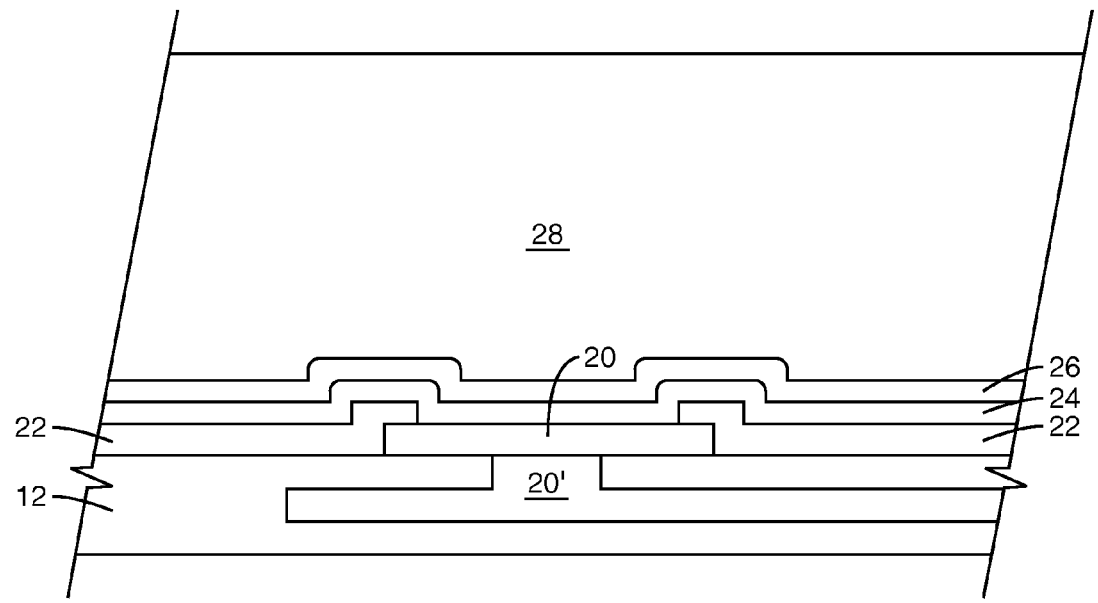
Figure 7:
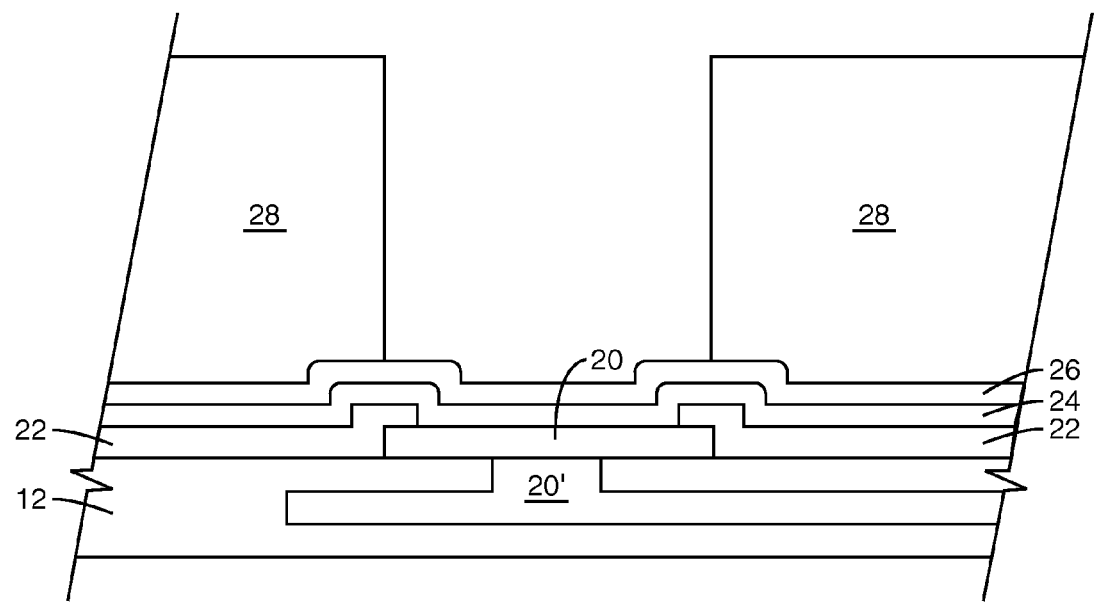
Figure 8:
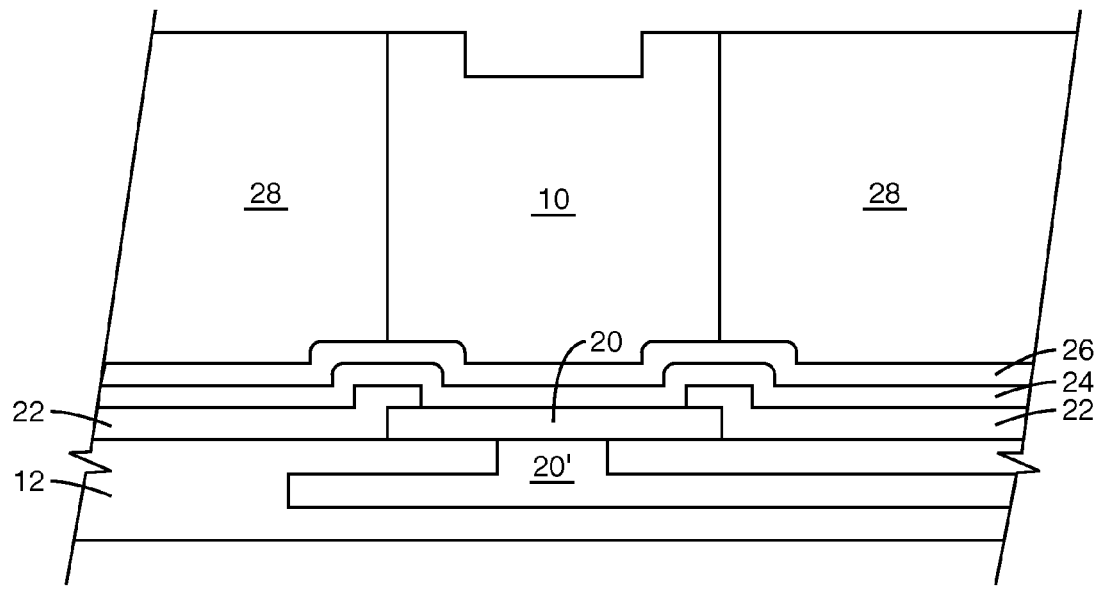

Next, a photo-resist material 28 is deposited over the seed layer 26, as shown in FIG. 6, and a portion of the photo-resist material 28 over the bond pad 20 is developed and exposed as shown in FIG. 7. The copper post 10 is formed over the exposed portion of the seed layer 26 using an electroplating process as shown in FIG. 8. In this embodiment, the copper post 10 may be approximately 45 µm or less in height. In an alternative embodiment, the metallic post may be more than 45 µm in height and may be made of a non-copper material, such as gold, nickel, or silver, which may be formed by an electroless process.

Figure 9:
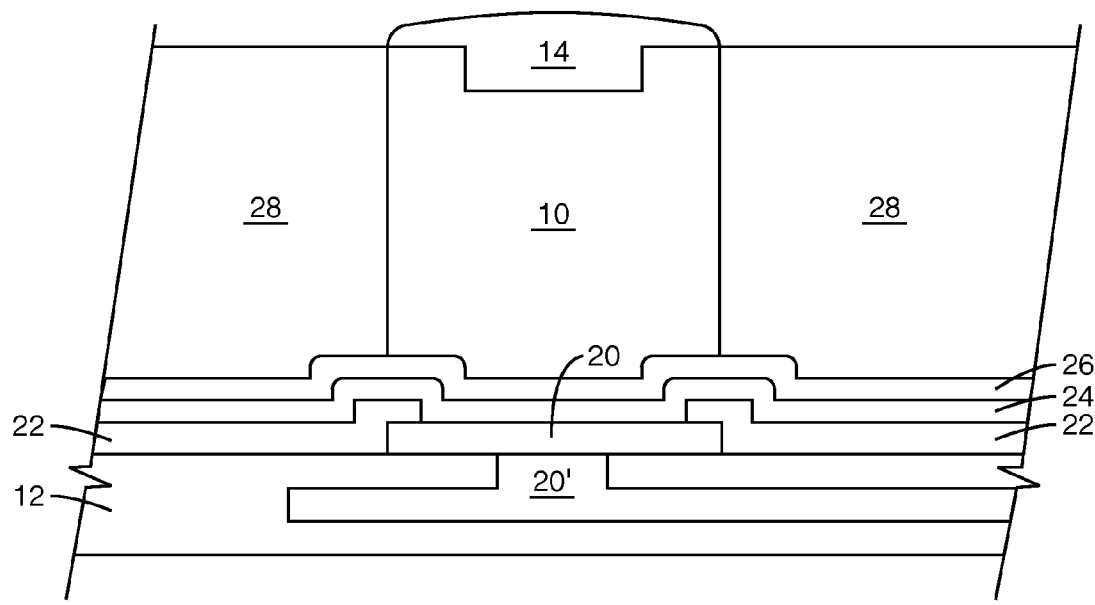

Next, the tip layer 14 is applied to the exposed tip of the copper post 10 as shown in FIG. 9. The tip layer 14 protects the tip of the copper post 10 from oxidation, further enhancing the wettability of the tip of the copper post 10. The tip layer 14 may be made of flash gold, tin, or other wettable electroplated material. Alternatively, the tip layer 14 may be an organic surface protectant (OSP), if the process for forming the non-copper post is an electroless process. In this alternative method, the non-copper post may be dipped into an OSP to form the tip layer 14.

Figure 10:
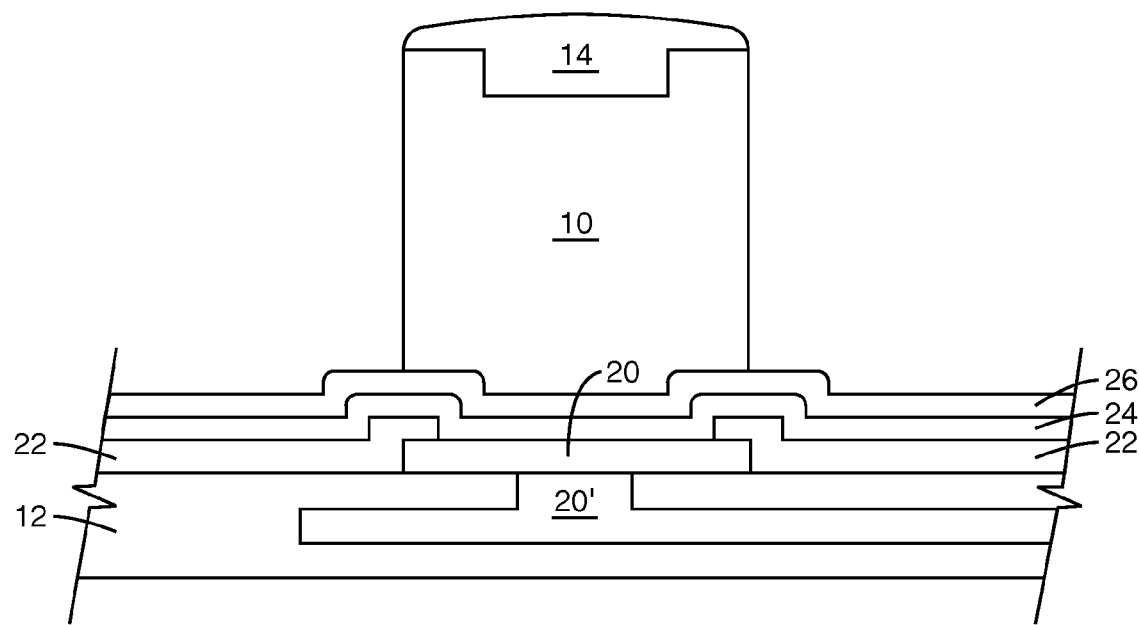
Figure 11:
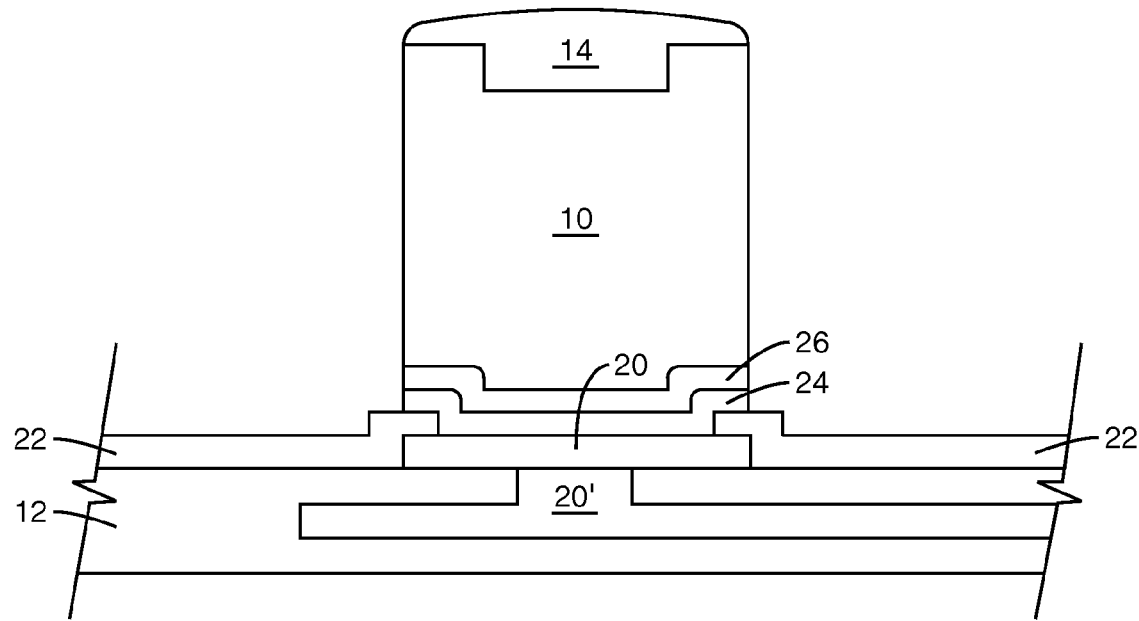

Next, the remaining photo-resist material 28 is removed from the seed layer 26 as shown in FIG. 10. The barrier layer 24 and the seed layer 26 may also be etched and removed from the surface of the flip-chip die 12 as shown in FIG. 11. The barrier layer 24 and the seed layer 26 may remain on the flip-chip die 12 between the flip-chip die 12 and the copper post 10. Lastly, the exposed portion of the copper post 10 will undergo oxidation. The oxidation will decrease the wettability of the sides of the copper post 10 when the solder bump 16 and tip layer 14 of the copper post 10 are connected to the substrate during reflow. Notably, the tip layer 14 prevents oxidation of the tip of the copper post 10.

Those skilled in the art will recognize improvements and modifications to the preferred embodiments of the present invention. All such improvements and modifications are considered within the scope of the concepts disclosed herein and the claims that follow.

What is claimed is:

1. A method comprising:
    forming a plurality of metallic posts on a flip-chip die, each metallic post having an exposed tip;
    forming a flash tin tip layer on the exposed tip of each metallic post;
    forming a plurality of solder bumps on a substrate, wherein the plurality of solder bumps are positioned to align with the plurality of metallic posts on the flip-chip die;
    after forming the flash tin tip layer on the exposed tip of each metallic post, positioning the flip-chip die over the substrate such that the flash tin tip layer of each of the plurality of metallic posts on the flip-chip die contacts a corresponding one of the plurality of solder bumps on the substrate; and
    heating the plurality of solder bumps to cause each one of the plurality of solder bumps to reflow and attach to the flash tin tip layer of each of the plurality of metallic posts when the plurality of solder bumps cool such that each metallic post contains no solder and solder is not placed on the exposed tips prior to positioning the flip-chip die over the substrate and heating the plurality of solder bumps.

2. The method of claim 1 wherein the plurality of metallic posts are copper.

3. The method of claim 1 wherein the height of a metallic post is less than about 45 µm.

4. The method of claim 1 wherein the flash tin tip layer prevents oxidation and increases wettability of the exposed tip of each metallic post.

5. The method of claim 1 wherein the plurality of metallic posts are formed by an electroless process.

6. The method of claim 1 wherein the height of a solder bump is between about 25 and 100 µm.

7. The method of claim 2 wherein forming each of the plurality of metallic posts comprises forming a passivation layer about a bond pad on the flip-chip die, forming a barrier layer over the bond pad, forming a seed layer over the barrier layer, and forming a copper post over the seed layer.

8. The method of claim 7 wherein the copper post is formed by an electroplating process.

9. The method of claim 7 further comprising oxidizing exposed portions of the copper post.

10. The method of claim 1 wherein the plurality of solder bumps are applied by screen-printing solder onto the substrate.

11. A flip-chip assembly formed by a process comprising:
    forming a plurality of metallic posts on a flip-chip die, each metallic post having an exposed tip;
    forming a flash tin tip layer on the exposed tip of each metallic post;
    forming a plurality of solder bumps on a substrate wherein the plurality of solder bumps are positioned to align with the plurality of metallic posts on the flip-chip die;
    after forming the flash tin tip layer on the exposed tip of each metallic post, positioning the flip-chip die over the substrate such that the flash tin tip layer of each of the plurality of metallic posts on the flip-chip die contacts a corresponding one of the plurality of solder bumps on the substrate; and
    heating the plurality of solder bumps to cause each one of the plurality of solder bumps to reflow and attach to the flash tin tip layer of each of the plurality of metallic posts when the plurality of solder bumps cool such that each metallic post contains no solder and solder is not placed on the exposed tips prior to positioning the flip-chip die over the substrate and heating the plurality of solder bumps.

12. The flip-chip assembly of claim 11 wherein the plurality of metallic posts are copper.

13. The flip-chip assembly of claim 11 wherein the height of a metallic post is less than about 45 μm.

14. The flip-chip assembly of claim 11 wherein the flash tin tip layer prevents oxidation and increases wettability of the exposed tip of each metallic post.

15. The flip-chip assembly of claim 11 wherein the plurality of metallic posts are formed by an electroless process.

16. The flip-chip assembly of claim 11 wherein the height of a solder bump is between about 25 and 100 μm.

17. The flip-chip assembly of claim 12 wherein forming each of the plurality of copper posts comprises forming a passivation layer about a bond pad on the flip-chip die, forming a barrier layer over the bond pad, forming a seed layer over the barrier layer, and forming a copper post over the seed layer.

18. The flip-chip assembly of claim 17 wherein the copper post is formed by an electroplating process.

19. The flip-chip assembly of claim 17 further comprising oxidizing exposed portions of the copper post.

20. The flip-chip assembly of claim 11 wherein the plurality of solder bumps are applied by screen-printing solder onto the substrate.

\* \* \* \* \*